United States Patent
Johnstone et al.

(10) Patent No.: US 7,817,762 B2
(45) Date of Patent: *Oct. 19, 2010

(54) METHOD AND APPARATUS FOR DETECTING LEADING PULSE EDGES

(75) Inventors: Colin Johnstone, Fife (GB); Eric Breakenridge, Alloa (GB)

(73) Assignee: Agilent Technologies, Inc., Santa Clara, CA (US)

( * ) Notice: Subject to any disclaimer, the term of this patent is extended or adjusted under 35 U.S.C. 154(b) by 1345 days.

This patent is subject to a terminal disclaimer.

(21) Appl. No.: 11/299,431

(22) Filed: Dec. 12, 2005

(65) Prior Publication Data

US 2006/0176082 A1    Aug. 10, 2006

(30) Foreign Application Priority Data

Dec. 15, 2004    (GB) ................................. 0427344.7

(51) Int. Cl.
*H04L 7/02* (2006.01)
(52) U.S. Cl. ...................... 375/360; 375/353; 375/354; 375/342; 375/345; 341/157; 341/155; 341/177
(58) Field of Classification Search ................. 375/360, 375/353, 354, 342, 345; 341/157, 155, 177
See application file for complete search history.

(56) References Cited

U.S. PATENT DOCUMENTS

| 4,542,525 | A | * | 9/1985 | Hopf | ............................ 381/56 |
| 5,058,168 | A | * | 10/1991 | Koyama | ..................... 704/233 |
| 5,237,589 | A | | 8/1993 | Hayakawa | |
| 5,315,688 | A | * | 5/1994 | Theis | ........................ 704/233 |
| 5,583,961 | A | * | 12/1996 | Pawlewski et al. | .......... 704/241 |
| 5,852,630 | A | * | 12/1998 | Langberg et al. | ............ 375/219 |
| 6,778,111 | B1 | | 8/2004 | Zhu | |
| 7,265,700 | B2 | * | 9/2007 | Johnstone et al. | ........... 341/157 |
| 2007/0001887 | A1 | * | 1/2007 | Johnstone et al. | ........... 341/155 |

FOREIGN PATENT DOCUMENTS

| EP | 1187330 A | 3/2002 |
| JP | 2004039134 A | 2/2004 |
| JP | 2004 039134 A | 2/2005 |

* cited by examiner

*Primary Examiner*—Shuwang Liu
*Assistant Examiner*—Kenneth Lam
(74) *Attorney, Agent, or Firm*—Marc Bobys (57) ABSTRACT

An apparatus and method for detecting leading pulse edges of a signal includes a controller, hysteresis threshold comparators and qualification timers. The controller uses the outputs from the timers in order to determine whether or not a transition of the input signal constitutes a leading pulse edge of the input signal.

7 Claims, 6 Drawing Sheets

Figure 1 (a)

PRIOR ART

Figure 1 (b)

PRIOR ART

METHOD AND APPARATUS FOR DETECTING LEADING PULSE EDGES

Foreign priority benefits under 35 U.S.C. §119 for the instant application are hereby claimed to Great Britain application 0427344.7, filed Dec. 15, 2004.

The present invention relates to a method and apparatus for detecting leading pulse edges, especially, though not exclusively for detecting leading edges of heavily modulated pulses and/or pulses in a noisy signal.

BACKGROUND

With the rapid growth of wireless telecommunication systems, system providers are challenged to provide quality radio frequency (RF) signals with maximum coverage. In a wireless telecommunications system, a mobile phone needs to be calibrated to provide the power necessary to reach the base station. On the other hand, in order to conserve battery life, the power transmitted should not be more than what is needed. The mobile phone must be able to tune the output power for an optimum connection. Also, the base station and mobile phone must not exceed the maximum allowable power transmitted according to government standards and regulations. Therefore, assuring that the transmitted power does not exceed the allowable limit, which is traced to a known standard, is a primary concern. Thus, accurate power measurements are important for maintaining a high quality connection in modern telecommunication systems.

As with many other types of signals, an RF signal can be made up of a sequence of pulses. In the case of a pulsed RF power signal, the pulses have a leading rising edge and a trailing falling edge. The power envelope of the RF signal is, in some cases, determined by the RF signal's modulation type.

Standard peak or sampling RF power meters include trigger circuitry which has to be capable of detecting the leading and trailing edges on the incoming power envelope. The detection of leading and trailing edges is then used in a data acquisition circuit in order to control the storage of signal samples in memory for later processing and measurement extraction. In order to try to detect the edges of the pulse, it is known to use a trigger level, or threshold, to detect whether the signal has crossed the threshold.

However, RF power envelopes can be very noisy and the power pulse may be heavily modulated, so that the modulation envelope of the pulse may cross over the pre-programmed trigger threshold at times other than the desired edges of the pulse. One well known method of coping with noisy signals is to apply hysteresis and trigger validation to the detection measurement.

Figure 1:
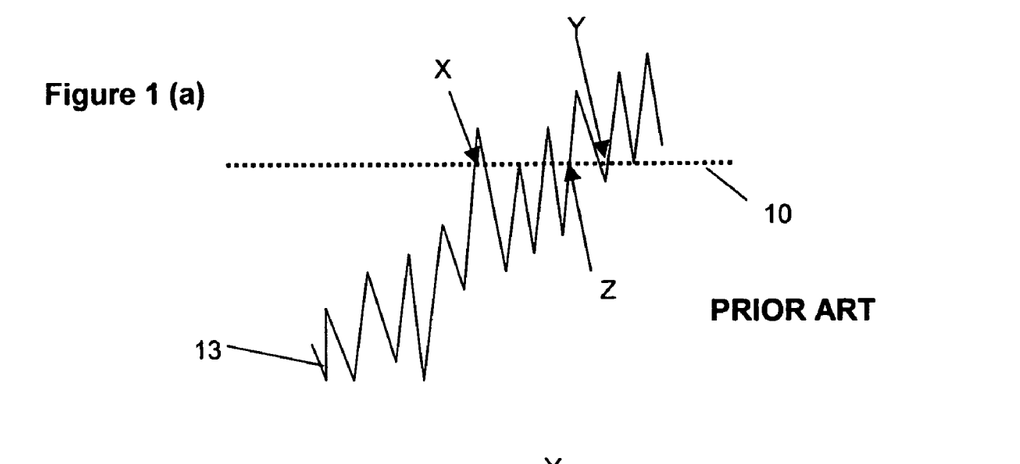

FIG. 1 (a) shows a typical well behaved (but noisy) detected RF power signal 13 having a leading rising edge rather masked by the noise spikes. The desire is to find the leading edge i.e. the point at which the detected RF power signal 13 crosses a trigger threshold 10. As can be seen, the noise spike at point X exceeds the trigger threshold 10, but the detected RF power signal 13 then immediately drops back below the trigger level 10. The first point at which the detected RF power signal 13 is wholly above the trigger threshold 10 is point Y. However, if the noise were to be filtered out then the actual trigger point would be at point Z. Therefore, to get a more accurate trigger, hysteresis is introduced, as shown in FIG. 1 (b). In this case, instead of having a single trigger threshold, two thresholds are provided, one on each side of the actual desired trigger threshold: an upper hysteresis threshold 11 and a lower hysteresis threshold 12.

In order for the trigger circuitry to detect a rising edge, the detected RF power signal 13 must rise above the upper hysteresis threshold 11 and not fall back below the lower hysteresis threshold 12. With this technique, point Z is the first point at which the detected RF power signal 13 has risen above the upper hysteresis level 11, but not fallen again below the lower hysteresis threshold 12. Even though the detected RF power signal 13 may fall below the actual trigger level 10, after rising above the upper hysteresis threshold 11, it does not fall below the lower hysteresis level 12 and therefore the rising edge is detected as being at point Z.

Figure 2:
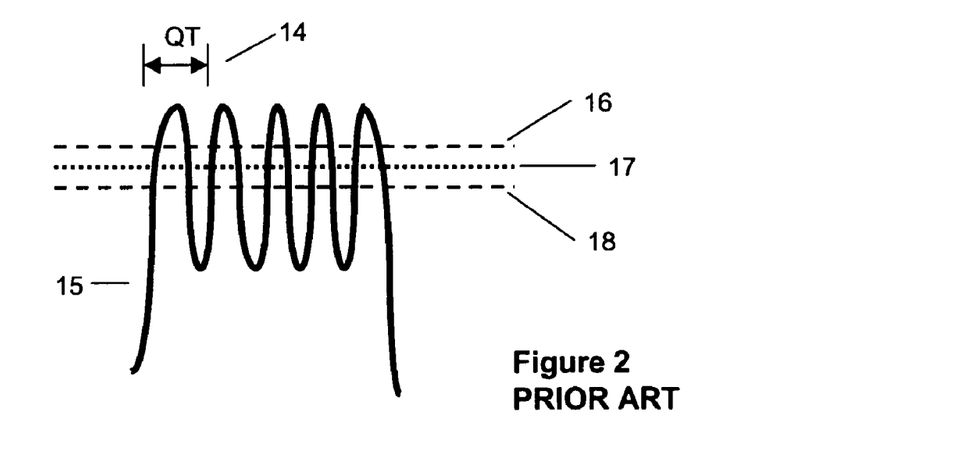
FIG. 2 shows a diagram of a modulated signal having detection of its leading rising edge being validated by the use of a qualification time, as is known in the prior art.

A trigger circuit can be made to trigger on very noisy signals by increasing the distance between the hysteresis thresholds. If the detected RF power signal 13 was pulsed, then there would always come a time when the signal did drop below the lower hysteresis threshold 12. For this reason the concept of validation is used, as shown in FIG. 2. In this case, qualification time 14 is set such that the signal 15 must remain above the lower hysteresis threshold 18 for the qualification time 14, in order to be considered a rising edge. The qualification time 14 must be carefully chosen to be large enough to reject noise, but small enough not to reject genuine pulses.

The qualification time 14 works for both rising and falling edges. A signal 15 that falls below the lower hysteresis threshold 18, must stay below the upper hysteresis threshold 16 for duration of the qualification time 14 for a falling edge to be considered to have been detected and the signal therefore to be "low". Once low, the signal 15 must then rise above the upper hysteresis level 16 and stay above the lower hysteresis level 18 for a rising edge to be considered to have been detected and the signal therefore to be in a "high" state. Validated low-to-high and high-to-low transitions constitute rising and falling edges, respectively. The method described so far is well known and in widespread use in oscilloscopes, as well as power meters.

A problem arises when the pulsed signal is a burst of digital modulation. Digital modulation, such as OFDM or 64QAM, can cause the signal envelope to cross over the trigger thresholds throughout the on-time of the signal, or pulse to be detected. Hysteresis and validation are needed for noise rejection, but, for example in the case of the waveform shown in FIG. 2, a qualification time that works well for noise rejection could cause a whole pulse to be missed, because the signal 15 always drops below the lower hysteresis threshold 18 within the qualification time 14 of every positive transition.

If the qualification time 14 is reduced to allow the front edge of the pulse to be detected then, in the example shown in FIG. 2, the modulation will meet the validation criteria, resulting in five small pulses being detected instead of one larger one. The known technique of trigger hold-off can be used to prevent problems arising from the multi-triggering by suppressing triggers for a time after the first detection. This also has the limitation that, when presented with pulses of non-deterministic width or interval, as can be present in current or proposed wireless LAN signals, it cannot provide a stable trigger. Thus, the known techniques cannot distinguish between distinct pulses, or a single pulse modulated at a frequency around twice the pulse width, or even noise spikes at a similar frequency.

The present invention therefore seeks to provide a method and apparatus for detecting leading pulse edges, especially, though not exclusively for detecting leading edges of heavily modulated pulses and/or pulses in a noisy signal, which overcomes, or at least reduces the above-mentioned problems of the prior art.

BRIEF SUMMARY

Accordingly, in a first aspect, the invention provides an apparatus for the detection of a leading pulse edge of an input signal, the apparatus comprising a controller, first and second hysteresis threshold comparators each having a first input for receiving the input signal, a second input for receiving a hysteresis threshold value and an output coupled to the controller, wherein the first and second hysteresis threshold comparators compare the input signal with first and second hysteresis threshold levels, respectively, first and second qualification timers, each being controlled by the controller and having a time out output coupled to the controller, wherein the controller receives the outputs of the comparators and the timers and controls starting of the timers to enable the controller to determine whether a transition of the input signal across a hysteresis threshold level constitutes a leading pulse edge of the input signal or not.

In one embodiment, the controller starts the first qualification timer when a first transition of the input signal across the first hysteresis threshold level is detected, starts the second qualification timer when a transition of the input signal across the second hysteresis threshold level is detected whilst the first qualification timer is timing, and wherein the controller validates the first transition as a leading edge of a pulse of the input signal if the input signal is above the first hysteresis threshold level again when the first qualification timer times out or before the second qualification timer times out.

The transition may be a rising transition and the controller may control the first qualification timer to start timing when a rising transition is detected by the first hysteresis threshold comparator, and wherein the rising transition is validated as a leading rising pulse edge of the input signal if the input signal remains above a lower hysteresis threshold level until the first qualification timer times out.

The transition may be a rising transition and the controller may control the first qualification timer to start timing when a rising transition is detected by the first hysteresis threshold comparator, and wherein the rising transition is validated as a leading rising pulse edge of the input signal if the input signal is above a lower hysteresis threshold level when the first qualification timer times out.

The transition may be a rising transition and the controller may control the first qualification timer to start timing when a rising transition is detected by the first hysteresis threshold comparator and may control the second qualification timer to start timing when a falling transition is detected by the second hysteresis threshold comparator whilst the first qualification timer is still timing, and wherein the rising transition is validated as a leading rising pulse edge of the input signal if the input signal crosses back above an upper hysteresis threshold level while the second qualification timer is still timing after the first qualification timer has timed out.

The controller may control the second qualification timer to restart timing each time a falling transition is detected by the second hysteresis threshold comparator whilst the first qualification timer is still timing.

The period timed by the first qualification timer may be the same as the period timed by the second qualification timer. Each qualification timer may time a period that is equal in length to a minimum pulse width.

According to a second aspect, the invention provides an apparatus for detecting pulses in an input signal comprising the apparatus for detection of a leading pulse edge as described above and wherein the controller receives the outputs of the comparators and the timers and controls starting of the timers to enable the controller to determine whether a transition of the input signal across a hysteresis threshold level constitutes a trailing pulse edge of the input signal or not.

In one embodiment, after a leading edge of a pulse has been detected, the controller may start the second qualification timer when a second transition of the input signal across the second hysteresis threshold level is detected, and wherein the controller validates the second transition as a trailing edge of a pulse of the input signal if the input signal remains below the second hysteresis threshold level when the second qualification timer times out.

The controller can differentiate between a single modulated pulse, a pair of noise spikes, or two separate pulses within the input signal.

According to a third aspect, the invention provides a method for detecting a leading pulse edge of an input signal, the method comprising:

starting a first qualification timer when a first transition of the input signal across a first hysteresis threshold is detected;

starting a second qualification timer when a transition of the input signal across a second hysteresis threshold is detected whilst the first qualification timer is timing; and validating the first transition as a leading edge of a pulse of the input signal if the input signal is above the first hysteresis threshold again when the first qualification timer times out or before the second qualification timer times out.

In one embodiment, the leading edge is a rising edge and the method may further comprise:

validating the first transition as a rising edge of a pulse of the input signal if the signal remains above a lower hysteresis threshold level until the first qualification timer times out; otherwise validating the first transition as a rising edge of a pulse of the input signal if the input signal is above the lower hysteresis threshold level when the first qualification timer times out.

The first qualification timer may time a period that is the same as a period timed by the second qualification timer Each qualification timer may time a period that is equal in length to a minimum pulse width.

According to a fourth aspect, the invention provides a method for detecting pulses in an input signal comprising the method as described above, and further comprises, after a leading edge of the input signal has been validated:

starting a second qualification timer when a second transition of the input signal across the second hysteresis threshold is detected; and validating the second transition as a trailing edge of the pulse of the input signal if the input signal remains below the second hysteresis threshold until the second qualification timer times out.

BRIEF DESCRIPTION OF THE DRAWINGS

One embodiment of the invention will now be more fully described, by way of example, with reference to the drawings, of which:

FIG. 1 (*a*) shows a diagram of a typical noisy leading rising edge of a signal being detected by reference to a single trigger threshold as is known in the prior art;

FIG. 1 (*b*) shows a diagram of the signal of FIG. 1 (*a*) with the leading rising edge being detected by reference to a pair of hysteresis thresholds as is known in the prior art;

FIG. 7 (a)-(c) a diagram of a waveform having a pair of peaks separated by a gap to illustrate how the embodiment of FIGS. 3 and 4 can be used to differentiate between two pulses, a modulated pulse, and two noise spikes.

DETAILED DESCRIPTION OF THE DRAWINGS

Figure 3:
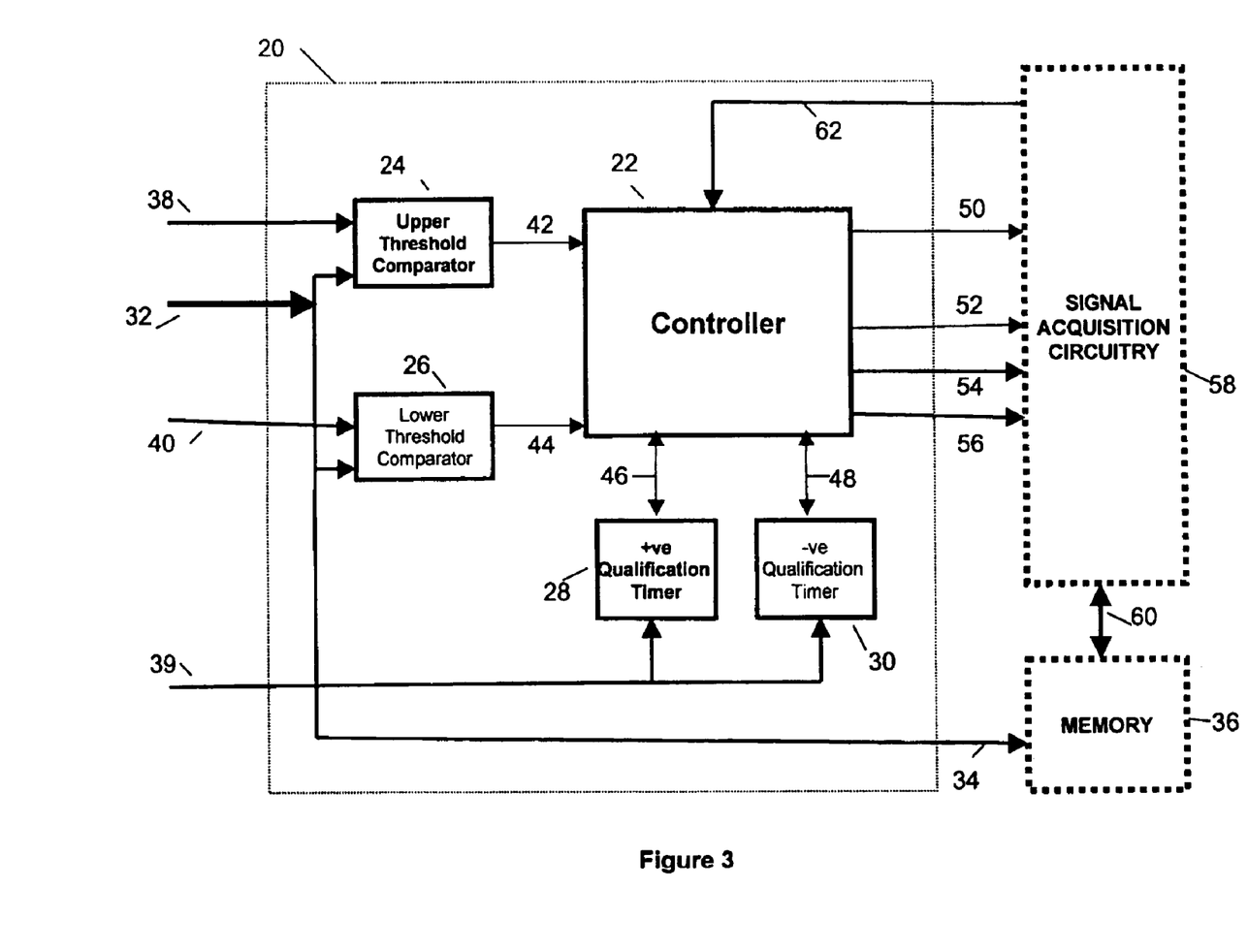
FIG. 3 is a schematic diagram of the architecture of trigger circuitry according to one embodiment of the present invention.

Accordingly, as shown in FIG. 3, an apparatus according to one embodiment of the present invention includes trigger mechanism circuitry 20 which comprises a controller 22 upper hysteresis threshold and lower hysteresis threshold comparators 24 and 26, a positive qualification timer 28 and a negative qualification timer 30.

A first input 32 to the trigger mechanism circuitry 20 provides an input signal from an A/D converter (not shown) in which the signal whose pulses are to be detected, for example an RF power signal, is digitised. This input 32 is passed to first inputs of the first and second comparators 24 and 26 and to a direct output 34 of the trigger circuitry 20 to a memory 36. The trigger circuitry 20 has two further inputs 38 and 40 providing predetermined upper and lower hysteresis threshold levels for the two comparators 24 and 26, respectively. A final input 39 to the trigger circuitry 20 provides a predetermined qualification time value to the positive and negative qualification timers 28 and 30. Outputs 42 and 44 of the comparators 24 and 26 are coupled to the controller 22, which is also coupled, via links 46 and 48, to the qualification timers 28 and 30, to receive their outputs, as well as controlling the operation of the qualification timers.

The controller 22 is used to detect rising and falling edges of pulses in the digitised signal from input 32, as will be explained more fully below. When the controller 22 detects a rising or falling edge, various outputs 50, 52, 54 and 56 are passed to signal acquisition circuitry 58, from where data relating to the input signal and the detected pulse edges is forwarded for further processing. The signal acquisition circuitry 58 controls the storage of the digitised signal samples in the memory 36 and passes the address in the memory 36 where the digitised data is to be stored to the memory 36 via link 60 and simultaneously via link 62 to the controller 22. Outputs 50 and 52 of the controller provide positive and negative validation triggers, respectively, to the acquisition control circuitry 58 providing an indication that particular transitions that have been stored in the memory 36 have been validated as edges. The addresses in the memory 36 of such transitions that have been validated as leading and trailing edges are passed to the acquisition control circuitry on outputs 54 and 56, respectively.

Operation of the trigger circuitry 20 will now be more fully explained with reference also to FIG. 4, which shows a flow diagram of the procedure. The controller 22 is, in this embodiment, implemented as a state machine and the various steps in the procedure explained below occur on clock cycles, so that the states are clearly known to the controller 22 at each cycle.

In the present embodiment, the pulses are positive, that is, it is expected that a leading edge of a pulse will be rising and the trailing edge of a pulse will be falling. It will be appreciated, however, that the invention can easily be implemented for the opposite situation, where the leading edge is falling and the trailing edge is rising. The procedure starts at the point marked START and continues with the following:

A1: Pre-qualify the waveform. Before any edges can be detected, the current state of the waveform must be determined, i.e. if, when the circuitry commences operation, the signal is in a high state, then a falling (trailing) edge will be looked for and vice versa. Since the trigger circuitry may start up in the middle of a modulated pulse, in A1 the trigger circuitry determines whether the signal is above or below the upper hysteresis threshold and waits for a qualification time above or below the upper hysteresis threshold before commencing "normal" operation. Once the initial stable state of the waveform has been determined, the procedure then moves to A2 or A13 depending on whether the edge to be looked for will be rising or falling. Thus, if the pre-qualified status is "high, then the procedure moves to A13 to detect a falling edge, whereas if the pre-qualified status is not "high", then the procedure moves to A2 to detect a rising edge.

A2: Rising Transition Detected above Upper Threshold? The presence of a rising transition is found when the upper threshold comparator 24 detects that the input signal has crossed the upper hysteresis threshold. If such a positive transition is found, the procedure moves on to the next A3. If no rising transition is found, then the procedure reverts to A2 until such a rising transition is found.

A3: Start Positive Timer. When the controller 22 receives the output from the comparator 24 that a rising transition of the upper hysteresis threshold has been detected, the controller starts the positive qualification timer 28. At this point, the memory address of the transition is latched, so that it can be passed to the acquisition control circuitry 58 if it is validated as an edge, as explained above. The procedure then moves on to A4.

A4: Signal Below Lower Threshold? Once a rising transition has been detected, it needs to be validated as a rising edge or not. If the signal level stays above the lower hysteresis threshold until the positive qualification timer times out, then it is considered that the rising transition does constitute a rising edge of a pulse, since the signal has not fallen back below the lower hysteresis threshold. Thus, the controller determines, in A4, whether the signal has moved below the lower threshold. If it has, then this validation criterion has failed, and the procedure moves on to A6. If not, and the signal remains above the lower hysteresis threshold, then the procedure moves to A5.

A5: Positive Timer Times Out. If the positive qualification timer 28 times out (the signal level having been detected as being above the lower hysteresis threshold), then it is considered that the rising transition constitutes a rising edge of a pulse, and a positive validation trigger is generated and the procedure moves to A11. If, however, the positive timer 28 does not time out, then the procedure moves back to A4 to determine whether the signal crosses below the lower hysteresis threshold, as described above.

A6: (re–) Start Negative Timer. If the signal drops below the lower hysteresis threshold within the period covered by the positive qualification timer 28, then the negative qualification timer 30 is started. In fact, the negative qualification timer 30 is restarted every time there is a falling transition across the lower hysteresis threshold whilst the positive qualification timer is running. Thus, no matter how many times the signal crosses the upper and lower hysteresis thresholds, the positive qualification timer 28 is started only once when the first rising transition of the upper hysteresis threshold is detected (when the circuitry is looking for a rising edge), but the negative qualification timer 30 is restarted (reset) every time there is a falling transition of the lower hysteresis threshold, provided the positive qualification timer is still running. With the negative qualification timer running, the procedure moves on to A7.

A7: Signal above Upper Threshold. Should the signal nevertheless be back above the upper hysteresis threshold at the time when the positive qualification timer 28 times out, it is considered that the original rising transition constitutes a rising edge of a pulse. Thus, in A7, the controller 22 determines whether the signal has moved above the upper threshold. If it has, then the procedure moves back to A5, to determine whether the positive qualification timer has timed out, in which case the original rising transition will be validated as a rising edge. If the controller 22 determines that the signal has not moved above the upper threshold, and the signal remains below the upper hysteresis threshold, then the procedure moves to A8.

A8: Positive Timer Times Out. At this point, the controller 22 determines whether the positive qualification timer 28 has timed out. If it has not, then the procedure reverts back to A7 to check whether the signal moves back above the upper threshold before the positive qualification timer does time out. If, however, the positive timer 28 does time out (the signal level having been detected as not being above the upper hysteresis threshold), then the procedure moves on to A9.

A9: Signal above Upper Threshold. As mentioned above, the negative qualification timer is restarted every time there is a falling transition of the lower hysteresis threshold, but only whilst the positive qualification timer is running. If the signal is below the lower hysteresis threshold, when the positive qualification timer times out, the original rising transition will still qualify as the rising edge, if the signal rises back above the upper hysteresis threshold before the negative qualification timer 30 times out (irrespective of how many times it has been restarted). Thus, the controller determines, in A9, whether the signal has moved above the upper threshold. If it has, then it is considered that the rising transition constitutes a rising edge of a pulse, and a positive validation trigger is generated and the procedure moves to A11. If not, and the signal has not crossed back above the upper hysteresis threshold, then the procedure moves on to A10.

A10: Negative Timer Times Out. At A10, the controller 22 determines whether the negative qualification timer 30 has timed out. If it has, then this validation criterion has failed, and the procedure moves back to A2 to look for a new rising transition. If not, then the procedure reverts to A9 to check whether the signal rises back above the upper hysteresis threshold before the negative qualification timer 30 times out.

A11: Rising Edge Validated. The transition recorded in A3 has been qualified in either A5 or A9 and a positive validation trigger has been generated. The positive validation trigger is output to the acquisition control circuitry 58, together with the memory address of the transition, and/or timing data of the rising transition. The procedure then moves to A12.

A12: Further Edges. This checks to see whether there are further edges to be detected. If there are, then the controller knows that the next edge will be a falling edge and the procedure moves to A13. If no further edges are to be detected, then the procedure EXITS.

A13: Falling Transition Below Lower Threshold Detected. A falling transition that crosses the lower hysteresis threshold is looked for. Such a falling transition is detected when the lower threshold comparator 26 detects that the input signal has crossed the lower hysteresis threshold. If such a falling transition is detected, the procedure moves on to A14. Otherwise, it reverts back to A13 to look for such a falling transition.

A14: Start Negative Timer. When the controller 22 receives the output from the comparator 26 that a falling transition of the lower hysteresis threshold has been detected, the controller starts the negative qualification timer 30. At this point, the memory address of the transition is latched, so that it can be passed to the acquisition control circuitry 58 if it is validated as an edge, as explained above. The procedure then moves on to the next A15.

A15: Signal above Upper Threshold. Once a falling transition has been found, it needs to be validated as a falling edge or not. As previously explained, when the signal falls below the lower hysteresis threshold due to a falling transition, the negative qualification timer is started. If the signal remains below the upper hysteresis threshold when the negative qualification timer times out, i.e. the signal has remained below the upper hysteresis threshold for a whole period of the negative qualification timer, falling transition is considered to be a falling edge. Thus, the controller determines, in A15, whether the signal has moved above the upper threshold. If it has, then it is considered that the falling transition does not constitute a falling edge of a pulse, and the procedure moves back to A13 to look for the next falling transition. If not, and the signal has not crossed back above the upper hysteresis threshold, then the procedure moves on to A16.

A16: Negative Timer Times Out. In this point, the controller 22 determines whether the negative qualification timer 30 has timed out. If it has, then it is considered that the falling transition does constitute a falling edge of a pulse and the controller provides a negative validation trigger for validating the falling transition that started the negative qualification timer. In this case, the procedure moves on to A17. If not, then the procedure reverts to A15 to check whether the signal rises back above the upper hysteresis threshold before the negative qualification timer 30 times out.

A17: Falling Edge Validated. The transition recorded in A14 has been qualified and a negative validation trigger has been generated. The negative validation trigger is output, together with the memory address, and/or timing data of the falling transition that has been validated. The procedure then moves to A18.

A18: Further Edges. This checks to see if there are further edges to be detected. If there are, then the controller knows that the next edge will be a rising edge and the procedure moves to A2. If no further edges are to be detected, then the procedure EXITS.

Figure 4:
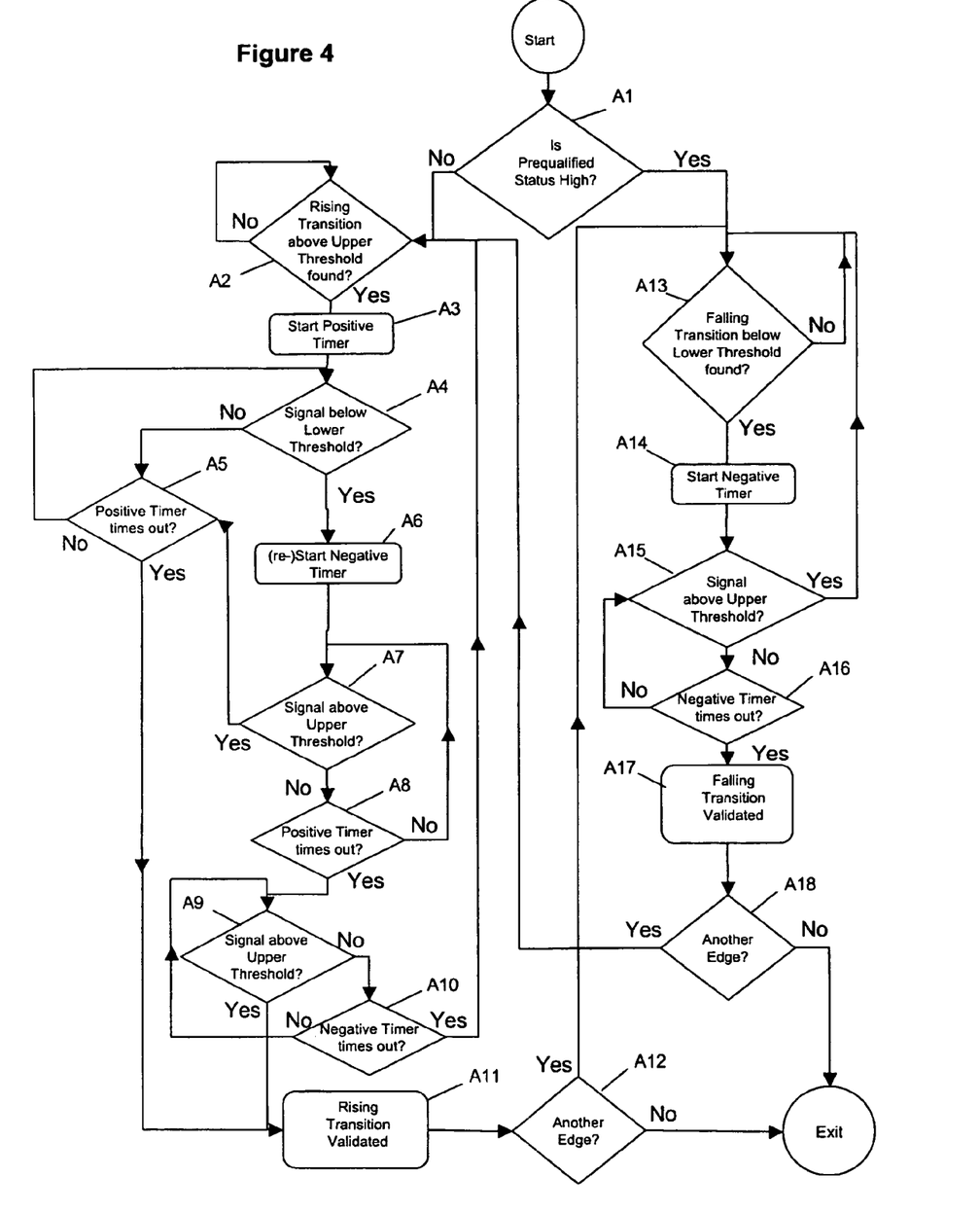
FIG. 4 is a flow diagram showing the procedure used by the trigger circuitry of FIG. 3 for detecting rising and falling edges of an input signal.

It should, of course, be noted that the procedure illustrated by the flow diagram of FIG. 4 has been designed such that a rising edge can start on the signal sample immediately following the qualification of a falling edge, with the qualification period of the positive and negative qualification timers being set to be the same as the minimum inter-pulse gap that is expected in the signal.

Examples of the way the procedure of FIG. 4 operates will now be explained with reference to two waveforms shown in FIGS. 5 and 6.

Figure 5:
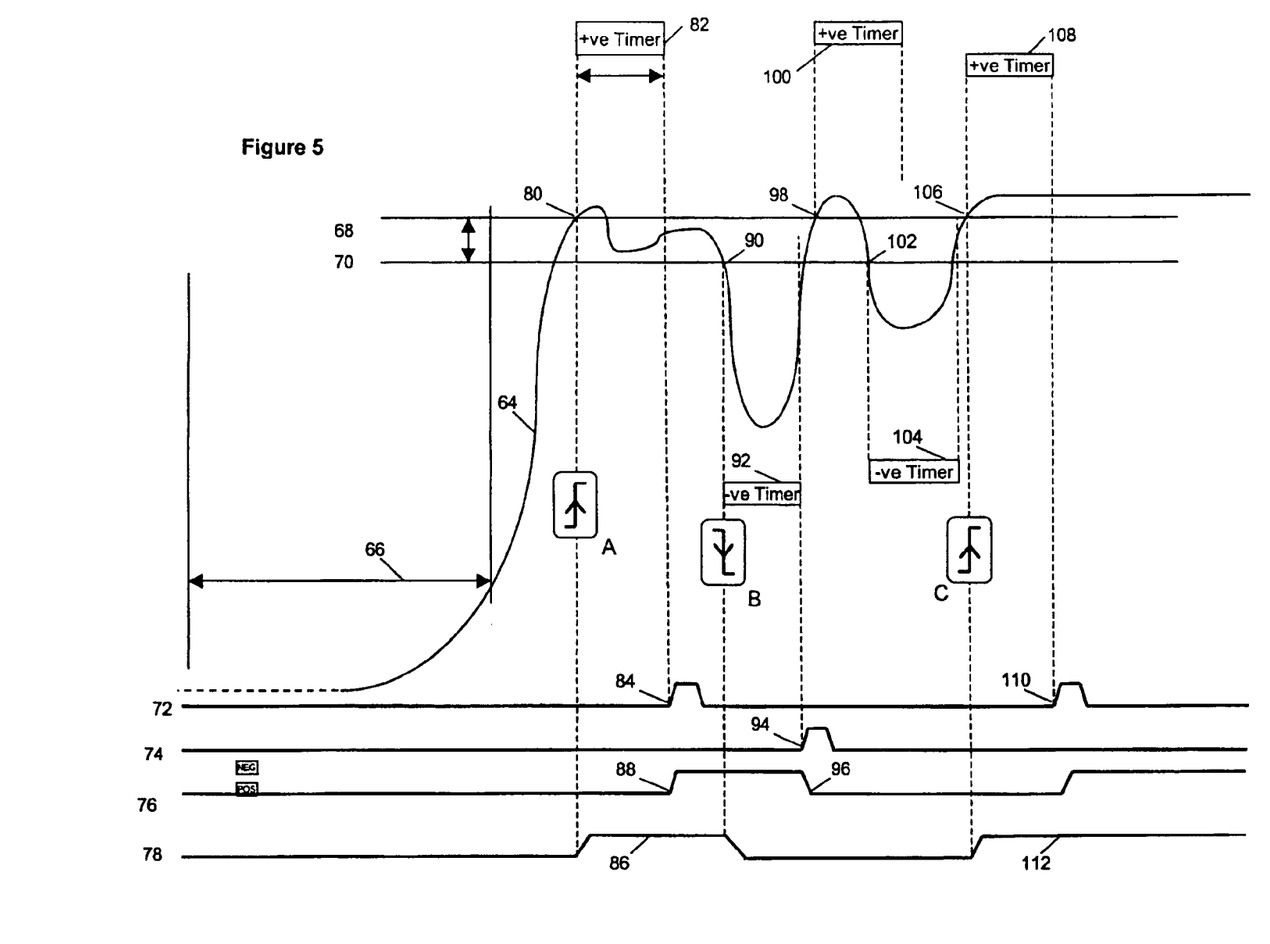
FIG. 5 shows a timing diagram with a first waveform showing how the embodiment of FIG. 3 detects the pulse edges.

In FIG. 5 there is shown a relatively simple waveform without any clear structure that is used to illustrate some of the procedure described above. Firstly, the status of the signal 64 is determined. This is shown within the period indicated by arrow 66, where the signal level stays below the level of the upper (and lower) hysteresis thresholds, indicated by lines 68 and 70, respectively, for a period greater than a qualification time, which may be provided by one of the two qualification timers. In any event, the signal state is determined as being "low", as indicated by digital signal 76, which is in a low state, indicating that the next edge to be detected is a rising edge.

Thus, as described above with reference to A2, the first rising transition that is detected by the comparator 24, occurs at point 80, where the signal 64 crosses over the upper hysteresis threshold 68. This causes the positive qualification timer 28 to be started, which then times a positive qualification period 82. Furthermore, the detection of the rising transition at point 80 also causes the address in the memory 36, where this part of the signal is stored, to be latched by the controller 22, in case this rising transition should later be validated as being a rising edge. At A3 of the procedure, it is determined that the signal remains above the lower hysteresis threshold 70, until the positive qualification timer times out (A5), so that a positive validation trigger 84 is generated, as shown in digital signal 72. When this positive validation trigger is generated, and the procedure moves to A11, the controller 22 validates the rising transition at point 80 as being a rising edge (indicated at A) and this is shown schematically as digital signal 78 indicated by the beginning of the pulse 86. It will, of course be appreciated that digital signal 78 cannot be generated in real time in parallel with the digital signals 72, 74 and 76, since, at the time the rising transition is first detected, it is not yet known whether it constitutes a rising edge or not.

When the positive validation trigger 84 is generated, this also causes the level of digital signal 76 to switch (as shown at point 88) to indicate that the input signal is in a "high" state, so that the next edge to be detected will be a falling edge. Moving on to A13, therefore, the next falling transition, indicated at point 90, where the signal 64 crosses over the lower hysteresis threshold 70 is detected. This causes the negative qualification timer 30 to be started, which then times a negative qualification period 92. Furthermore, the detection of the falling transition at point 90 also causes the address in the memory 36, where this part of the signal is stored, to be latched by the controller 22, in case this falling transition should later be validated as being a falling edge. In this case, it can be seen that the signal remains below the lower hysteresis threshold 70, until the negative qualification timer times out, so that a negative validation trigger 94 is generated, as shown in digital signal 74, per A15 and A16. When this negative validation trigger is generated, and the procedure moves to A17, the controller 22 validates the falling transition at point 90 as being a falling edge (indicated at B) and this is shown schematically in digital signal 78 as the end of pulse 86.

When the negative validation trigger 94 is generated, this also causes the level of digital signal 76 to switch (as shown at point 96) to indicate that the input signal is in a "low" state, so that the next edge to be detected will be a rising edge. Moving back to A2, therefore, the next rising transition, indicated at point 98, occurs where the signal 64 crosses over the upper hysteresis threshold 68. This causes the positive qualification timer 28 to be started, which then times a positive qualification period 100. Again, the detection of the rising transition at point 98 also causes the address in the memory 36, where this part of the signal is stored, to be latched by the controller 22. In this case, it can be seen that the signal 64 falls below the lower hysteresis threshold 70 (as shown at point 102) while the positive qualification period 100 is still running, causing the negative qualification timer 30 to start timing a negative qualification period 104. However, after the positive qualification period 100 ends (A8), and the negative qualification period 104 also ends (A10), without the signal 64 having crossed over the upper hysteresis threshold 68, the rising transition at point 98 is considered not to be a rising edge and therefore the procedure reverts to A2 to look for the next rising transition, which is found at point 106, where the signal 64 crosses over the upper hysteresis threshold 68. Again, the positive qualification timer 28 is started, which then times a positive qualification period 108 and the detection of the rising transition at point 106 also causes the address in the memory 36, where this part of the signal is stored, to be latched by the controller 22. In this case, it can be seen that the signal 64 remains above the lower hysteresis threshold 70 for the positive qualification period 108, so that a positive validation trigger 110 is generated, causing the rising transition at point 106 to be validated as a rising edge (indicated at C) of pulse 112.

Figure 6:
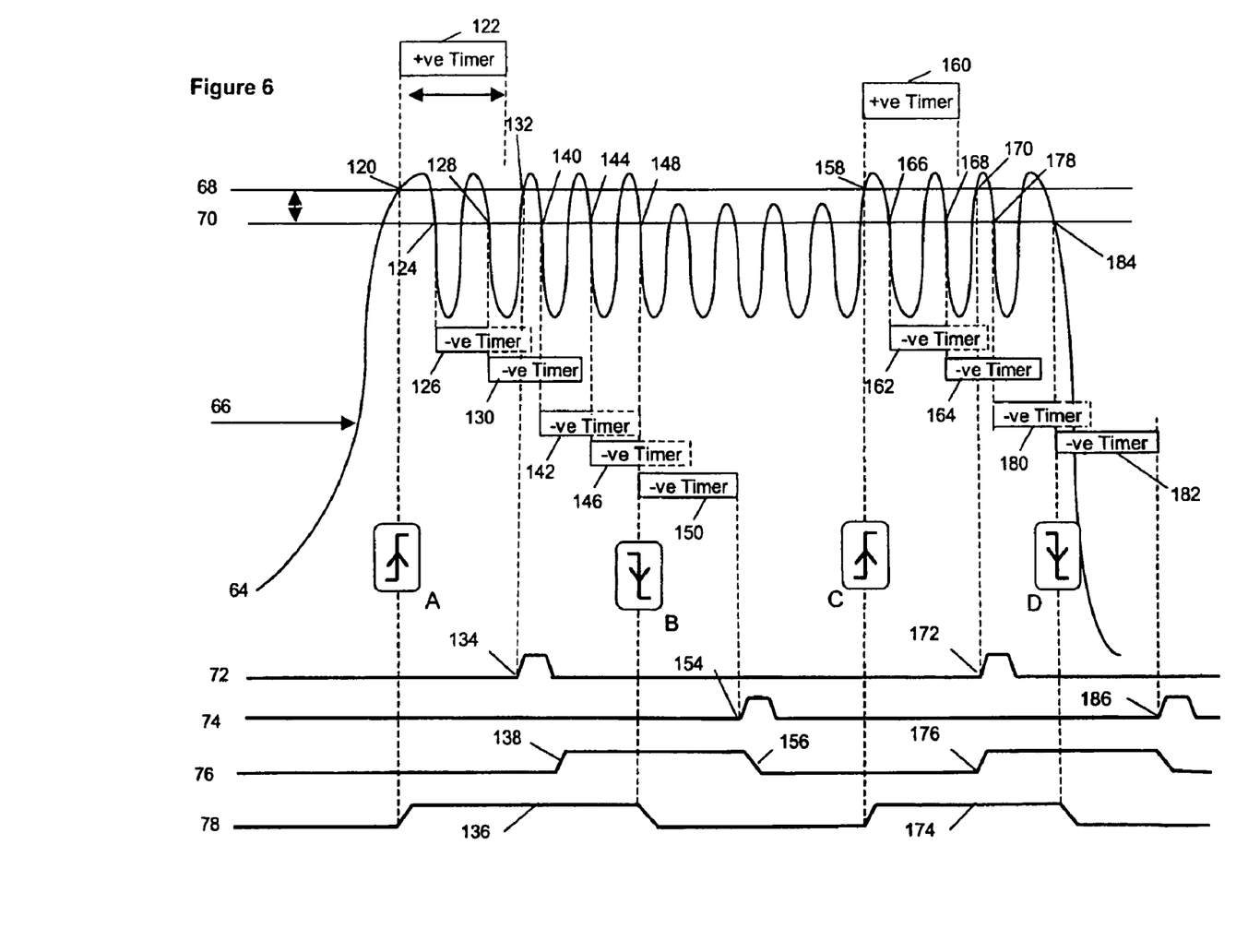
FIG. 6 shows a timing diagram with a second waveform showing how the embodiment of FIG. 3 detects the pulse edges.

In FIG. 6, there is shown a waveform having two pulses which are heavily modulated, making their detection difficult. Similar reference numerals are used in this Figure to those of FIG. 5, for the same elements, such as signals and thresholds. The signal 64 may be first "pre-filled", or stored in memory before performing the analysis, so that a signal history can be collated—this is normal practise. Again, the initial state of the signal 64 is first determined, as indicated by arrow 66.

When the signal 64 crosses over the upper hysteresis threshold 68 at point 120, the positive qualification timer 28 starts to time a positive qualification period 122 and the address in the memory 36, where this part of the signal is stored, to be latched by the controller 22. In this case, the signal 64 falls below the lower hysteresis level 70 (at point 124) within the positive qualification period 122, so that negative qualification timer 30 is started to time negative qualification period 126. As the signal 64 is heavily modulated, it rises back above the upper hysteresis threshold 68 before the positive qualification period expires, therefore the rising transition is not validated as a rising edge (yet). Instead, as the signal 64 falls back below the lower hysteresis threshold 70 (at point 128), the negative qualification timer 30 is restarted (to start a new negative qualification period 130). In this case, the signal 64 again rises above the positive hysteresis threshold 68 at point 132, but this rising transition occurs after the positive qualification period 122 has expired, but before the negative qualification period has expired. Accordingly, positive validation trigger 134 is generated and the controller 22 validates the rising transition at point 120 as being a rising edge (indicated at A) and this is shown schematically in digital signal 78 as the beginning of pulse 136. Again, the level of digital signal 76 is switched (as shown at point 138) to indicate that the input signal is in a "high" state, so that the next edge to be detected will be a falling edge.

Thus, a pulse that starts with a lot of modulation will trigger at the start of the pulse. An isolated spike with a positive leading edge will not qualify and so will not cause a trigger to be generated.

An RF pulse is produced when an RF transmitter is turned on and finishes when the RF transmitter is turned off. Whilst the transmitter is on, it may or may not produce a waveform with a modulated envelope, but when it is not transmitting it invariably produces a constant low value. It was discerned from this that the trigger for the back of the pulse only has to find the last time the pulse drops below the lower hysteresis threshold and stays below it.

Thus, as shown in FIG. 6 at point 140, the next falling transition is detected when the signal 64 crosses the lower hysteresis threshold 70. Again, this causes the negative qualification timer 30 to start to time negative qualification period 142. As the signal 64 is heavily modulated, it rises back above the upper hysteresis threshold 68 before the negative qualification period 142 has expired, and falls back below the lower hysteresis threshold 70 (at point 144), so that the negative qualification timer 30 is restarted (to start a new negative qualification period 146). This occurs again when the signal 64 rises above the upper hysteresis threshold 68 before the restarted negative qualification period 146 has expired, and falls back below the lower hysteresis threshold 70 (at point 148), so that the negative qualification timer 30 is restarted (to start a new negative qualification period 150). This time, however, the signal 64 does not rise again above the upper hysteresis threshold 68 (only above the lower hysteresis threshold 70). Therefore, a negative validation trigger 154 is generated, as shown in digital signal 74 and the controller 22 validates the falling transition at point 148 as being a falling edge (indicated at B) and this is shown schematically in digital signal 78 as the end of pulse 136. When the negative validation trigger 154 is generated, this also causes the level of digital signal 76 to switch (as shown at point 156) to indicate that the input signal is in a "low" state, so that the next edge to be detected will be a rising edge. On each transition below the lower threshold level 70, as the negative qualification time is restarted, the memory address is re-latched within the controller 22. Thus, when the falling transition is validated as a falling edge, the last transition address is available on negative address output 56.

The next rising transition is detected when the signal 64 crosses over the upper hysteresis threshold 68 at point 158, so that the positive qualification timer 28 starts to time a positive qualification period 160 and the address in the memory 36 where this part of the signal is stored, is latched by the controller 22. In this case, negative qualification timer 30 is started twice to time negative qualification periods 162, 164 due to two falling transitions 166, 168 during the positive qualification period 160. The signal 64 again rises above the positive hysteresis threshold 68 at point 170 after the positive qualification period 160 has expired, but before the last negative qualification period 164 has expired. Accordingly, positive validation trigger 172 is generated and the controller 22 validates the rising transition at point 158 as being a rising edge (indicated at C) and this is shown schematically in digital signal 78 as the beginning of pulse 174. Again, the level of digital signal 76 is switched (as shown at point 176) to indicate that the input signal is in a "high" state, so that the next edge to be detected will be a falling edge.

The next falling transition is detected when the signal 64 crosses the lower hysteresis threshold 70 at point 178. Again, this causes the negative qualification timer 30 to start to time negative qualification period 180, but needs to be restarted (to start a new negative qualification period 182) when the signal 64 goes back above the upper hysteresis threshold 68 and then drops down below the lower hysteresis threshold 70 at point 184. This time, however, the signal 64 does not rise again above the upper hysteresis threshold 68 so that a negative validation trigger 186 is generated when the negative qualification period 182 expires, as shown in digital signal 74, and the controller 22 validates the falling transition at point 184 as being a falling edge (indicated at D) and this is shown schematically in digital signal 78 as the end of pulse 174.

It will be apparent from the above examples, that a transition of the signal may be validated as an edge of a pulse after a variable amount of time from the point where either the upper or lower threshold is crossed in order to indicate a validated edge. This means that the fact that an edge has occurred cannot be passed to the signal acquisition circuitry until the validation has been completed. Furthermore, the actual edge transition point cannot be found by simply subtracting a fixed time from the validation trigger generation point since, as has been seen, the qualification time is dependent upon the waveform shape. It takes longer to validate a modulated pulse compared with a simple square pulse. For this reason it is necessary to capture the timing of the first and last transitions as they occur. This "timing" information is then passed to the power meter's signal acquisition circuitry together with an indication of validation triggers. Address information for the validated edges in the memory may be provided, as described above.

It will be appreciated that the qualification time should not be greater than the minimum desired pulse width. By setting the qualification time equal to the minimum pulse width, only one value is required, simplifying any trigger circuitry that uses qualification timers. Thus, the minimum pulse width detectable by this method will equal the minimum gap between pulses.

Figure 7:
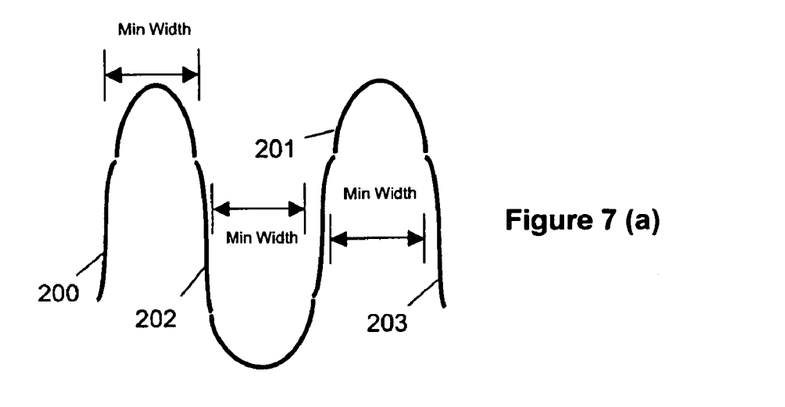

The combination of the more complex triggering algorithm for the front edge trigger mechanism, combined with a simpler back edge trigger algorithm, allows the automatic determination of whether an input signal includes a noise spike, a modulated pulse or a pair of closely adjacent RF power pulses, which can then be used within a standard instrument to perform pulse related measurements. As can be seen in FIG. 7, a pair of peaks separated by a gap can be considered to be two pulses (FIG. 7(a)), a modulated pulse (FIG. 7(b)), or two noise spikes (FIG. 7(c)). In each case, the minimum pulse width is set to be the same, but, with the above described embodiment of the present invention, the edge detection apparatus can differentiate between them.

As can be seen in FIG. 7(a), if the qualification time is set to the minimum pulse width, the rising transitions 200 and 201 and falling transitions 202 and 203 will be determined by the apparatus described above to be rising and falling edges, respectively, because each peak is wider than the minimum pulse width, and the gap is wider than the minimum pulse width.

On the other hand, as shown in FIG. 7(b), the apparatus described above will validate the first rising transition 200 as a rising edge, but will not validate first falling transition 202 as a qualified falling edge because it occurs within the minimum pulse width time from the validated first rising edge 200, so that, of course, the second rising transition 201 is not qualified as a rising edge because the apparatus is not looking for rising edges. In this case, the second falling transition 203 will be validated as a falling edge because it occurs after expiry of a minimum pulse width (negative qualification time) that started at the first falling transition. Thus, the waveform will be detected as a single modulated pulse.

Finally, as shown in FIG. 7(c), the apparatus described above will not validate the first rising transition 200 as a rising edge because the first falling edge 202 occurs within the minimum pulse width (positive qualification time) and the second rising transition 201 does not occur until after the negative qualification time (gap width) has expired. Therefore, that the second rising edge is again detected as a potential new rising edge, which does not qualify as a validated rising edge because the second falling edge occurs before the minimum pulse width (positive qualification time) has expired (although it may, of course, still qualify as a rising edge if the next rising transition occurs before the negative qualification time expires. Otherwise, this waveform will be treated as just a pair of noise spikes.

It will be appreciated that although only certain particular embodiments of the invention has been described in detail, various modifications and improvements can be made by a person skilled in the art without departing from the scope of the present invention. For example, although in the above described embodiment, the qualification time is the same for both the positive and negative qualification timers, it will be appreciated that the positive qualification time can be made different to the negative qualification time, if desired. The controller 57 can be implemented as a state machine, or in software executed by a processor. Such alternative embodiments of the invention can be implemented as a computer program product for use with a computer system, the computer program product being, for example, a series of computer instructions stored on a tangible data recording medium, such as a diskette, CD-ROM, ROM, or fixed disk, or embodied in a computer data signal, the signal being transmitted over a tangible medium or a wireless medium, for example microwave or infrared. The series of computer instructions can constitute all or part of the functionality described above, and can also be stored in any memory device, volatile or non-volatile, such as semiconductor, magnetic, optical or other memory device. The procedure described with reference to FIG. 4 can also be applied retroactively, using software, to an stream of samples that has previously been captured in order to delineate the edges. This can have advantages over known algorithms for performing a similar task.

The invention claimed is:

1. A method for detecting a leading pulse edge of an input signal, the method comprising:

starting a first qualification timer when a first transition of the input signal across a first hysteresis threshold is detected;

starting a second qualification timer when a transition of the input signal across a second hysteresis threshold is detected whilst the first qualification timer is timing; and validating the first transition as a leading edge of a pulse of the input signal if the input signal is above the first hysteresis threshold again when the first qualification timer times out or after the first qualification timer has timed out but before the second qualification timer times out.

2. A method according to claim 1, wherein the leading edge is a rising edge and further comprising: validating the first transition as a rising edge of a pulse of the input signal if the input signal remains above a lower hysteresis threshold level until the first qualification timer times out; otherwise validating the first transition as a rising edge of a pulse of the input signal if the input signal is above the lower hysteresis threshold level when the first qualification timer times out.

3. A method according to claim 1, wherein the first qualification timer times a period that is the same as a period timed by the second qualification timer.

4. A method according to claim 1, wherein each qualification timer times a period that is equal in length to a minimum pulse width.

5. A method for detecting pulses in an input signal comprising the method of claim 1, and further comprising, after a leading edge of the input signal has been validated:

starting a second qualification timer when a second transition of the input signal across the second hysteresis threshold is detected; and validating the second transition as a trailing edge of the pulse of the input signal if the input signal remains below the second hysteresis threshold until the second qualification timer times out.

6. A non-transitory computer readable medium embodying a computer program element, causing a processor to execute a procedure to implement the method of claim 1.

7. A non-transitory computer readable medium, having a program stored thereon, where the program is to make a computer execute a procedure to implement the method of claim 1.

* * * * *